(12) United States Patent
Kwon et al.

(10) Patent No.: US 9,030,095 B2
(45) Date of Patent: May 12, 2015

(54) ORGANIC ELECTRO-LUMINESCENCE DISPLAY DEVICE AND MANUFACTURING METHOD THEREOF

(71) Applicant: LG Display Co., Ltd., Seoul (KR)

(72) Inventors: Seung Ho Kwon, Daegu (KR); Hyo Dae Bae, Ansan-si (KR); Seong Ho Mo, Cheongju-si (KR)

(73) Assignee: LG Display Co., Ltd., Seoul (KR)

( * ) Notice: Subject to any disclaimer, the term of this patent is extended or adjusted under 35 U.S.C. 154(b) by 53 days.

(21) Appl. No.: 13/679,737

(22) Filed: Nov. 16, 2012

(65) Prior Publication Data

US 2013/0075710 A1 Mar. 28, 2013

Related U.S. Application Data

(62) Division of application No. 12/506,027, filed on Jul. 20, 2009, now Pat. No. 8,323,065.

(30) Foreign Application Priority Data

Jul. 22, 2008 (KR) .................. 10-2008-0071102
Jul. 25, 2008 (KR) .................. 10-2008-0072513

(51) Int. Cl.
*H01L 51/52* (2006.01)
*H01L 51/56* (2006.01)
(Continued)

(52) U.S. Cl.
CPC ........ *H01L 27/3225* (2013.01); *H01L 27/3253* (2013.01); *H01L 51/5237* (2013.01); *H01L 51/0024* (2013.01)

(58) Field of Classification Search
CPC .................. H01L 27/3251; H01L 27/3253
USPC .............................. 313/500–512
See application file for complete search history.

(56) References Cited

U.S. PATENT DOCUMENTS 7,238,548 B2 7/2007 Kurita et al.
7,708,614 B2 5/2010 Harada
(Continued)

FOREIGN PATENT DOCUMENTS

CN 1459996 12/2003
CN 1010197837 1/2008
(Continued)

OTHER PUBLICATIONS

Korean Office Action dated Nov. 19, 2013.
(Continued)

*Primary Examiner* — Mariceli Santiago
(74) *Attorney, Agent, or Firm* — Morgan, Lewis & Bockius LLP

(57) ABSTRACT

An OLED device is disclosed. The OLED device includes a first substrate including a driver element and a connection electrode connected to the driver element, a second substrate including an organic light emission diode element, a contact spacer electrically connected to the connection electrode, and a sealant disposed into a cavity which is formed by the first and second substrates, the connection electrode, the organic light emission diode element, and the contact space. Herein, the sealant is bonded to the contact spacer and the connection electrode and maintains the electric connection between the contact spacer and the connection electrode. In this manner, the driver element and the organic light emission diode element are protected from external oxygen and/or moisture, and the electric connection between the connection electrode and the contact spacer is reinforced. Accordingly, the contact defect between the connection electrode and the contact spacer can be prevented and the structural strength of the OLED device can be greatly improved.

17 Claims, 8 Drawing Sheets

(51) Int. Cl.
*H01L 27/32* (2006.01)
*H01L 51/00* (2006.01)

(56) References Cited

U.S. PATENT DOCUMENTS

| | | |
|---|---|---|
| 7,792,489 B2 | 9/2010 | Hirakata et al. |
| 8,188,475 B2 | 5/2012 | Lee et al. |
| 2003/0127972 A1 | 7/2003 | Han et al. |
| 2005/0064780 A1 | 3/2005 | Auch et al. |
| 2008/0001864 A1 | 1/2008 | Lee et al. |
| 2008/0012477 A1 | 1/2008 | Koo et al. |
| 2008/0018245 A1 | 1/2008 | Kim et al. |

FOREIGN PATENT DOCUMENTS

| | | |
|---|---|---|
| EP | 1684366 A1 | 7/2006 |
| JP | 2002244589 A | 8/2002 |
| JP | 2003332064 A | 11/2003 |
| KR | 1020080001851 A | 1/2008 |
| KR | 1020080002338 A | 1/2008 |
| KR | 1020080006304 A | 1/2008 |

OTHER PUBLICATIONS

KR Office Action dated Feb. 28, 2013.

ORGANIC ELECTRO-LUMINESCENCE DISPLAY DEVICE AND MANUFACTURING METHOD THEREOF

CROSS-REFERENCE TO RELATED APPLICATION

This application is a divisional of copending U.S. patent application Ser. No. 12/506,027 filed on Jul. 20, 2009, which claims priority to Korean Patent Application Nos. 10-2008-0071102 and 10-2008-0072513, filed on Jul. 22, 2008 and Jul. 25, 2008, respectively, each of which is hereby incorporated by reference in its entirety for all purposes.

BACKGROUND

1. Field of the Disclosure

This disclosure relates to an organic electro-luminescence display device, and particularly to an organic electro-luminescence display device, and a manufacturing method thereof.

2. Description of the Related Art

As the information society grows, flat display devices capable of displaying information have been widely developed. These flat display devices include liquid crystal display (LCD) devices, organic electro-luminescence display (OLED) devices, plasma display devices, and field emission display devices.

Among the above flat display devices, the OLED devices can be light and thin because they do not need backlight units required by the LCD devices. Also, the OLED devices are manufactured through simple processes in comparison with the LCD devices so that they cut down their manufacturing costs. Moreover, the OLED devices have several features such as a low voltage drive, a high luminous efficiency, a wide viewing angle. Accordingly, the OLED devices have caught more of the attention as one of next-generation display devices.

The OLED device has a configuration such that a drive element and an organic light emission diode element are formed on a single substrate. Due to this, their manufacturing processes are complicated, thereby causing more of the manufacturing defects. To address this shortcoming, another configuration wherein the driver element and the organic light emission diode element are formed on substrates different from each other has recently researched and developed.

FIG. 1 is a cross sectional view showing schematically an OLED device of the related art. Referring to FIG. 1, a first substrate 1 has a driver element 2 thereon and a second substrate 3 has an organic light emission diode element 4 formed thereon. For the electrical connection of the driver element 2 and the organic light emission diode element 4, a contact spacer 5 is disposed therebetween. Moreover, a sealant 6 is disposed along the edges of the first and second substrates 1 and 3 and combines those each other. Then, a space pressure between the first and second substrates 1 and 3 is decreased to contact the contact spacer 5 with the driver element 2 and the organic light emission diode element 4.

In such a configuration of the OLED device, the driver element 2 applies a signal to the organic light emission diode element 4 through the contact spacer 5. In accordance therewith, the organic light emission diode element 4 generates lights corresponding to the signal applied from the driver element 2.

However, the internal pressure into the cavity between the first and second substrates 1 and 3 increases as time passes. Due to this, the contact spacer 5 is separated from the driver element 2 and loses contact with it. In the end, the organic light emission diode element 4 is not luminous resulting in a defect such as a black spot (or dot).

Specially, in the OLED devices which are enlarged in accordance with the size of display device, this black spot defect occurs frequently and in proportion to their greater size. As a result, some large OLED devices, which incur a high manufacturing cost, can not be used due to heavy costs.

Also, if the pressure between the first and second substrates 1 and 3 is lowered, the contact spacer 5 is in simple contact with the driver element 2, thereby deteriorating the structural strength of the OLED device.

Furthermore, moisture and/or oxygen can intrude into the OLED device through the sealant 6 and can cause performance defects of the driver element 2 and the organic light emission diode element 4. Since the organic light emission diode element 4 is very delicate under exposure to moisture and oxygen, its material characteristics deteriorate under such exposure, thereby causing a weakening in brightness, color shift, and other defects.

BRIEF SUMMARY

Accordingly, the present embodiments are directed to an OLED device that substantially obviates one or more of problems due to the limitations and disadvantages of the related art, and a manufacturing method thereof.

An object of the present embodiment is to provide an OLED device that is able to prevent a connection defect between the driver element and the contact spacer, and a manufacturing method thereof.

Another object of the present embodiment is to provide an OLED device that is able to protect a driver element and an organic light emission diode element from the intrusion of external moisture or oxygen, and a manufacturing method thereof.

Still another object of the present embodiment is to provide an OLED device of improved a structural strength, and a manufacturing method thereof.

Additional features and advantages of the embodiments will be set forth in the description which follows, and in part will be apparent from the description, or may be learned by practice of the embodiments. The advantages of the embodiments will be realized and attained by the structure particularly pointed out in the written description and claims hereof as well as the appended drawings.

According to a first aspect of the present embodiment, an OLED device includes: a first substrate, wherein a driver element and a connection electrode are disposed on the first substrate, and the connection electrode is connected to the driver element; a second substrate opposed to the first substrate, wherein an organic light emission diode element is disposed on the second substrate; a contact spacer disposed on the second substrate and electrically connected to the connection electrode; and a first sealant disposed into a cavity which is formed by the first and second substrates, the connection electrode, the organic light emission diode element, and the contact space. The first sealant is bonded to the contact spacer and the connection electrode and maintains the electrical connection between the contact spacer and the connection electrode.

Further, the organic light emission diode element may include a first electrode, an organic light emission layer, and a second electrode, and the contact spacer may include a protrusion member and a contact electrode unified with the second electrode in one body.

Moreover, the connection electrode may be electrically connected to the contact electrode of the contact spacer.

Furthermore, the first sealant may be bonded to the first and second substrates, the connection electrode, the organic light emission diode element, and the contact spacer.

The organic electro-luminescence display device may further comprise a second sealant disposed along the edge areas of the first and second substrates.

A manufacturing method of OLED device, according to a second aspect of the present embodiment, includes: providing a first substrate, wherein an organic light emission diode element and a contact spacer are disposed on the first substrate; disposing a sealant film of first sealant material on the first substrate; disposing a second substrate on the sealant film, wherein a driver element and a connection electrode are disposed on the second substrate, and the connection electrode is connected to the driver element; simultaneously applying a first heat and a pressure to the second substrate, to melt the sealant film and to fill the melted sealant film into a cavity, which is formed by the first and second substrates, the connection electrode, the organic light emission diode element, and the contact spacer; and applying a second heat to the second substrate during a fixed period and hardening the sealant film, to form a first sealant. The first sealant is bonded to the contact spacer and the connection electrode and maintains the electrical connection between the contact spacer and the connection electrode.

The method may further comprise coating a second sealant material along the edge area of the first substrate before disposing the second substrate.

Furthermore, the first heat may be in the range of about 60° C. to 100° C., and the pressure may be in the range of about 0.2 Pa to 3 Mpa.

Moreover, the second heat may be in the range of about 100° C. to 120° C., and the fixed period may be in the range of about two to three hours.

Further, the second sealant material may be the same as the first sealant material.

Alternatively, the second sealant material may be different from the first sealant material.

Furthermore, the first and second sealant material may include at least one selected from materials of epoxy group, acryl group, imide group, and silane group.

Alternatively, the second heat may be in the range of about 80° C. to 120° C., and the fixed period may be in the range of about a half hour to three hours.

An OLED device, according to a third aspect of the present embodiment, includes: a first substrate, wherein a driver element and a connection electrode are disposed on the first substrate, and the connection electrode is connected to the driver element; a second substrate opposed to the first substrate, wherein an organic light emission diode element is disposed on the second substrate; a contact spacer disposed on the second substrate and electrically connected to the connection electrode; and a first sealant disposed into a cavity which is formed by the first and second substrates, the connection electrode, the organic light emission diode element, and the contact space, and including a plurality of conduction balls. The first sealant is bonded to the contact spacer and the connection electrode and maintains the electrical connection of the contact spacer and the connection electrode.

Further, the organic light emission diode element may include a first electrode, an organic light emission layer, and a second electrode, and the contact spacer may include a protrusion member and a contact electrode unified with the second electrode in one body.

Moreover, the connection electrode may be electrically connected to the contact electrode of the contact spacer through the conduction balls.

Furthermore, the electrical connection between the contact and the connection electrodes may be maintained by the conduction balls.

Further, the first sealant may be bonded to the first and second substrates, the connection electrode, the organic light emission diode element, and the contact spacer.

The organic electro-luminescence display device may further comprise a second sealant disposed along the edge areas of the first and second substrates.

Moreover, the first sealant may be formed in a film type member that the conduction balls are mixed and scattered into a sealant material.

Furthermore, the first sealant may be formed in a liquid phase member that the conduction balls are mixed and scattered into a sealant material.

Further, the conduction balls may be disposed at least at a predetermined position in the sealant material, and the predetermined position corresponds to the contact spacer.

A manufacturing method of OLED device, according to a fourth aspect of the present embodiment, includes: providing a first substrate, wherein an organic light emission diode element and a contact spacer are disposed on the first substrate; disposing a sealant film on the first substrate, wherein the sealant film includes a plurality of conduction balls mixed and scattered into a first sealant material; disposing a second substrate on the sealant film to combine the first and second substrates, wherein a driver element and a connection electrode are disposed on the second substrate and the connection electrode is connected to the driver element; simultaneously applying a first heat and a pressure to the combined first and second substrates, to melt the sealant film and to fill the melted sealant film into a cavity, which is formed by the first and second substrates, the connection electrode, the organic light emission diode element, and the contact spacer; and applying a second heat to the combined first and second substrates during a fixed process period and hardening the melted sealant film, to form a first sealant. The first sealant is bonded to the contact spacer and the connection electrode, and the electrical connection of the contact spacer and the connection electrode is maintained by the conduction balls included in the first sealant.

A manufacturing method of OLED device, according to a fifth aspect of the present embodiment, includes: providing a first substrate, wherein an organic light emission diode element and a contact spacer are disposed on the first substrate; coating a liquid phase sealant on the first substrate, wherein the liquid phase sealant includes a plurality of conduction balls mixed and scattered into a first sealant material; disposing a second substrate on the liquid phase sealant to combine the first and second substrates, wherein a driver element and a connection electrode are disposed on the second substrate and the connection electrode is connected to the driver element; simultaneously applying a first heat and a pressure to the combined first and second substrates, to melt the liquid phase sealant and to fill the melted liquid phase sealant into a cavity, which is formed by the first and second substrates, the connection electrode, the organic light emission diode element, and the contact spacer; and applying a second heat to the combined first and second substrates during a fixed process period and hardening the melted liquid phase sealant, to form a first sealant. The first sealant is bonded to the contact spacer and the connection electrode, and the electrical connection of the contact spacer and the connection electrode is maintained by the conduction balls included in the first sealant.

The methods may further comprise coating a second sealant material along the edge area of the first substrate before disposing the second substrate.

Furthermore, the first heat may be in the range of about 60° C. to 100° C., and the pressure may be in the range of about 0.2 Pa to 3 Mpa.

Further, the second heat may be in the range of about 80° C. to 120° C., and the fixed period maybe in the range of about a half hour to three hours.

Moreover, the second sealant material may be the same as the first sealant material.

Alternatively, the second sealant material may be different from the first sealant material.

Furthermore, the first and second sealant material may include at least one selected from materials of epoxy group, acryl group, imide group, and silane group.

Moreover, the conduction balls may be disposed at least at a predetermined position in the first sealant material, and the predetermined position corresponds to the contact spacer.

An OLED device, according to a sixth aspect of the present embodiment, includes: a first substrate, wherein a driver element and a connection electrode are disposed on the first substrate and the connection electrode is connected to the driver element; a second substrate opposed to the first substrate, wherein an organic light emission diode element is disposed on the second substrate; a contact spacer disposed on the second substrate and electrically connected to the connection electrode; and a first sealant disposed between the contact spacer and the connection electrode and including a plurality of conduction balls. The first sealant is bonded to the contact spacer and the connection electrode, and the electrical connection between the contact spacer and the connection electrode is maintained by the conduction balls included in the first sealant.

Moreover, the conduction balls may be disposed at least at a predetermined position in the first sealant, and the predetermined position corresponds to the contact spacer.

A manufacturing method of OLED device, according to a seventh aspect of the present embodiment, includes: providing a first substrate, wherein an organic light emission diode element and a contact spacer are disposed on the first substrate; coating a liquid phase sealant, which includes a plurality of conduction balls mixed and scattered into a first sealant material, on the contact spacer on the first substrate; disposing a second substrate, wherein a driver element and a connection electrode are disposed on the second substrate and the connection electrode is connected to the driver element, on the second substrate to combine the first and second substrates; simultaneously applying a first heat and a pressure to the combined first and second substrates, to melt the liquid phase sealant and to fill the melted sealant film between the connection electrode and the contact spacer; and applying a second heat to the combined first and second substrates during a fixed process period and hardening the melted liquid phase sealant, to form a first sealant. The first sealant is bonded to the contact spacer and the connection electrode, and the electrical connection between the contact spacer and the connection electrode is maintained by the conduction balls included in the first sealant.

The method may further comprise coating a second sealant material along the edge area of the first substrate before disposing the second substrate.

Furthermore, the first heat may in the range of about 60 to 100, and the pressure may be in the range of about 0.2 Pa to 3 Mpa.

Further, the conduction balls may be disposed at least at a predetermined position in the first sealant material, and the predetermined position corresponds to the contact spacer.

It is apparent to those skilled in the art that various modifications, variations and combinations can be made based on the above content.

Other systems, methods, features and advantages will be, or will become, apparent to one with skill in the art upon examination of the following figures and detailed description. It is intended that all such additional systems, methods, features and advantages be included within this description, be within the scope of the invention, and be protected by the following claims. Nothing in this section should be taken as a limitation on those claims. Further aspects and advantages are discussed below in conjunction with the embodiments. It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the embodiments and are incorporated in and constitute a part of this application, illustrate embodiment(s) of the invention and together with the description serve to explain the disclosure. In the drawings.

DETAILED DESCRIPTION

Figure 1:
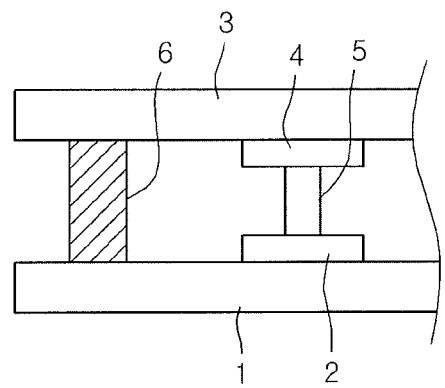
FIG. 1 is a schematic view showing an OLED device of related art.

Reference will now be made in detail to the embodiments of the present disclosure, examples of which are illustrated in the accompanying drawings. These embodiments introduced hereinafter are provided as examples in order to convey their spirits to the ordinary skilled person in the art. Therefore, these embodiments might be embodied in a different shape, so are not limited to these embodiments described here. Also, the size and thickness of the device might be expressed to be exaggerated for the sake of convenience in the drawings.

Wherever possible, the same reference numbers will be used throughout this disclosure including the drawings to refer to the same or like parts.

Figure 2:
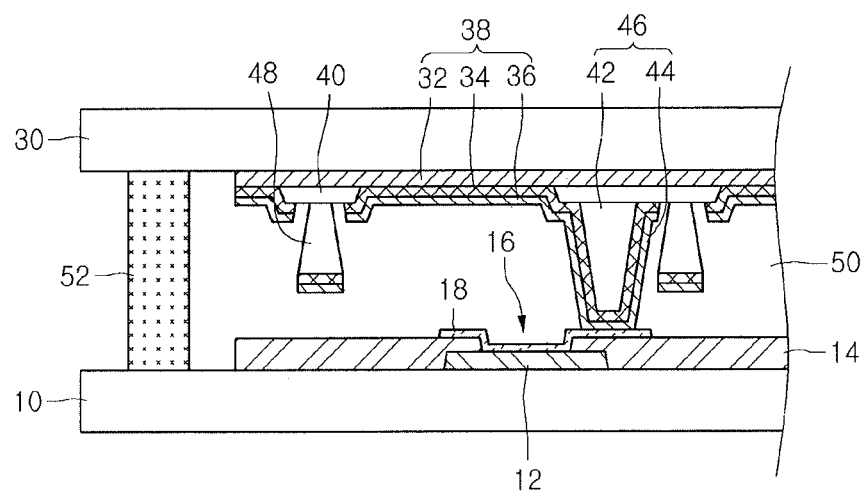
FIG. 2 is a cross sectional view showing an OLED device according to a first embodiment of the present disclosure.

FIG. 2 is a cross sectional view showing an OLED device according to a first embodiment of the present disclosure. Referring to FIG. 2, the OLED device includes a first substrate 10, which has a driver element 12 and a connection electrode 18 contacting the driver element 12, and a second substrate 30 having an organic light emission diode element 38. The first and second substrates 10 and 30 are arranged opposite each other. The organic light emission diode element 38 can include any one of red, green, and blue organic light emission diode elements. The red, green, and blue organic light emission diode elements may be arranged in respective pixel regions. In the luminous drive system described above, that is, in case of emitting lights toward the exterior through second substrate 30, the first substrate 10 may be from a non-transparent material such as a metal material, while the second substrate 30 may be from a transparent material, for example, a glass material or a plastic material. The connection electrode 18 of the driver element 12 is electrically connected to the organic light emission diode element 38 through a contact spacer 46.

A first sealant 50 is disposed between the first and second substrates 10 and 30. The first sealant 50 can be bonded to the first and second substrates 10 and 30, the connection electrode 18, the organic light emission diode element 38, the contact spacer 46, and a second sealant 52. In other words, the first sealant 50 is filled into a cavity which is formed by the first and second substrates 10 and 30, the connection electrode 18, the organic light emission diode element 38, the contact spacer 46, and the second sealant 52.

Figure 3A:
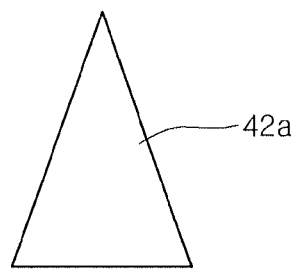
FIGS. 3A and 3B are cross sectional views showing contact spacer shapes which are included in the first embodiment of the present disclosure.
Figure 3B:
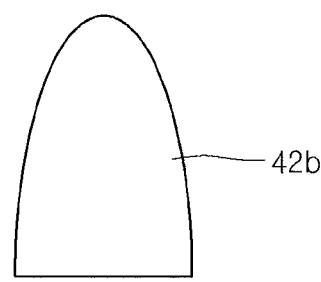

The first sealant 50 may be of a film type. More specifically, the first sealant 50 is provided in a sealant film of sealant material. The sealant film is disposed between the first and second substrates 10 and 30. The disposed sealant film is molted by heat and pressure which are applied to the first and second substrates 10 and 30 so that the molted sealant material is filled into the cavity formed by the first and second substrates 10 and 30, the connection electrode 18, the organic light emission diode element 38, the contact spacer 46, and the second sealant 52. The melted sealant material is then hardened. In accordance therewith, the first sealant 50 is bonded to the first and second substrates 10 and 30, the connection electrode 18, the organic light emission diode element 38, the contact spacer 46, and the second sealant 52, in such a manner that it is filled up into the cavity formed by the first and second substrates 10 and 30, the connection electrode 18, the organic light emission diode element 38, the contact spacer 46, and the second sealant 52. For the electrical connection of the contact spacer 46 and the connection electrode 18, the first sealant 50 preferably does not remain on the surface of the contact spacer 46 (i.e., on the surface of the contact spacer 46 which is opposed to the connection electrode 18). To this end, the contact spacer 46 can have an end portion which is formed in an acute angle profile shape 42a or in a round profile shape 42b, as shown in FIG. 3A or FIG. 3B. This end portion of the contact spacer 46 will be explained in detail through the manufacturing processes described below.

The first and second substrates 10 and 30 are combined by the second sealant 52. The second sealant 52 is disposed along the edges of the first and second substrates 10 and 30. In contrast, the first sealant 50 is preferably not disposed between the connection electrode 18 and the contact spacer 46 because the contact spacer 46 must be connected to the connection electrode 18.

In this manner, since the first sealant 50 fills the cavity (space) formed by the first and second substrates 10 and 30, the connection electrode 18, the organic light emission diode element 38, the contact spacer 46, and the second sealant 52, it together with the second sealant 52 can thoroughly prevent external oxygen or moisture from contacting the driver element 12 or the organic light emission diode element 46.

Also, the first sealant 50 is bonded to the contact spacer 46 and the connection electrode 18 and is hardened, so that it forces the contact spacer 46 and the connection electrode 18 to contact each other. Accordingly, the contact defects between the contact spacer 46 and the connection electrode 18 can be thoroughly and substantially prevented.

Moreover, as the first sealant 50 fills the cavity, which is formed by the first and second substrates 10 and 30, the connection electrode 18, the organic light emission diode element 38, the contact spacer 46, and the second sealant 52, there is no any empty space (or cavity) provided between the first and second substrates 10 and 30. Therefore, a variation of pressure is not generated between the first and second substrates 10 and 30, and the contact defects between the contact spacer 46 and the connection electrode 18 can be thoroughly and substantially prevented.

Furthermore, the first sealant 50 is forcibly bonded to the first and second substrates 10 and 30, the connection electrode 18, the organic light emission diode element 38, the contact spacer 46, and the second sealant 52, so that the structural strength of the OLED device can be greatly improved.

Meanwhile, the first and second sealants 50 and 52 may include a thermal setting material or an optical setting material. For example, the first and second sealant 50 and 52 can be formed from any one which is selected from epoxy group materials, acryl group materials, imide group materials, and silane group materials.

In addition the first and second sealant 50 and 52 can be formed of the materials different from each other. For example, the first sealant 50 may be from any one of the imide group materials and the second sealant 52 may be from any one of the epoxy group materials.

The OLED device according to the first embodiment of the present disclosure will now be explained in detail.

On the first substrate 10, the driver elements 12 are arranged. Also, gate lines and data lines (not shown) can be arranged to cross each other on the first substrate 10. The first substrate 10 can be defined into pixel regions by the gate lines and the data lines.

Each of the driver elements 12 can include at least one switch transistor, drive transistor, and capacitor, which are not shown in the drawing. The switch transistor is connected to the gate line and the data line. This switch transistor is activated by a gate signal on the gate line and selectively applies a data signal on the data line to the capacitor. The capacitor stores the data signal from the switch transistor and maintains the data signal during one frame period. The drive transistor generates an amount of drive current corresponding to the data signal which is stored in the capacitor. The drive current is applied to the organic light emission diode element 38 on the second substrate 30 through the contact spacer 46. The organic light emission diode element 38 emits a light of brightness corresponding to the drive current which is applied from the drive transistor.

A protective layer (or a passivation layer) 14 for protecting the driver elements 12 is disposed to cover the driver elements 12 on the first substrate 10. The protective layer 14 has contact holes 16 each exposing the respective driver elements 12. More specifically, each contact hole 16 can expose a drain electrode of the corresponding drive transistor which is included in the driver element 12.

The connection electrodes 18 are arranged on the protective layer 14, to be connected to the drain electrodes of the respective drive transistors through the respective contact holes. The connection electrodes 18 come in electrical contact with the respective contact spacers 46. In particular, a contact surface of the connection electrode 18 can be formed to have an area (or a size) larger than an area of a contact surface of the contact spacer 46, at least, in order to secure a shift margin of the contact spacer 46.

The second substrate 30 includes the organic light emission diode elements 38 arranged by the pixel regions. Each organic light emission diode element 38 can consist of a first electrode 32, an organic light emission layer 34, and a second electrode 36 which are sequentially formed on the second substrate 30.

The first electrode 32 can be disposed on the entire surface of the second substrate 30. In other words, the first electrode 32 can be formed in one body, in order to be commonly connected to all the organic light emission diode elements 38 on all the pixel regions. This first electrode 32 may be from a transparent conduction material capable of transmitting lights. For example, the first electrode 32 can include indium-tin-oxide ITO or indium-zinc-oxide IZO.

On the first electrode 32, a buffer pattern 40 is disposed in correspondence with the boundary areas of the pixel regions. The buffer pattern 40 may be formed of an insulation material. For example, the buffer pattern 40 can include silicon oxide or silicon nitride.

A separator 48 is disposed on the buffer pattern 40. The separator 48 allows the organic light emission diode elements 38 to be formed in the respective pixel regions. In other words, the organic light emission diode elements 38 can be formed separately from each other by the pixel regions, by means of the separator 48. This separator 48 can be formed in a taper shape (or an inverted trapezoid shape). As such, the organic light emission layer 34 or the second electrode 36 can be independently formed by the pixel regions by means of the separator 48, upon the formation of the organic light emission layer 34 or the second electrode 36 on the first electrode 32.

Protrusion members 42 are arranged on the buffer pattern 40. Each protrusion member 42 is a framework for forming a shape of the contact spacer 46 described below. The protrusion member 42 can be formed in an ordinary trapezoid shape. In accordance therewith, a contact electrode 44 to be disposed thereon can be formed on the entire surface (i.e., on the upper and side surfaces) of the protrusion member 42.

The organic light emission layer 34 is disposed on the first electrode 32 corresponding to each pixel region. The organic light emission layer 34 can include a red organic material layer displaying red colors, a green organic material layer displaying green colors, and a blue organic material layer displaying blue colors. The red, green, and blue organic light emission layers can be arranged on the respective pixel regions in the first electrode 32. Moreover, the same organic material as the organic light emission layer 34 can be further disposed on the protrusion member 42. Alternatively, the organic light emission layer 34 can be disposed only on each pixel region.

There is the second electrode 36 disposed on the organic light emission layer 34 in each pixel region. As with the organic light emission layer, the second electrode 36 is disposed in each pixel region.

This second electrode 36 may be from a conductive material which has a work function higher than that of the first electrode 32. Also, the second electrode 36 can be formed from a conductive material of superior light reflectivity, so as to reflect lights generated in the organic light emission layer 34 toward the first electrode 32. To this end, the second electrode 36 can include a single layer formed from any one among Ag, Cu, Au, Li, Ca, Ba, and Hg. Alternatively, the second electrode 36 can be any one among a double layer of Li/Al, a double layer of Ca/Al, a double layer of Ba/Al, a triple layer of Al/Ag/Ca, and a triple layer of Al/Ca/Ag. In another formation, the second electrode 36 can be formed from an alloy of Mg and Al or an alloy of Li and Al.

Moreover, the same conductive material as the second electrode 36 is formed on the organic light emission layer 34, which is also disposed on the protrusion member 32, and becomes the contact electrode 44. The contact electrode 44 can be formed of the same layer with the second electrode 36 and is disposed in the pixel region. And, the contact electrode 44 can be unified with the second electrode 36 in one body. Also, the contact electrode 44 is disposed on the entire surface (i.e., the upper and side surfaces) of the protrusion member 42.

This contact electrode 44 together with the protrusion member 42 forms the contact spacer 46. Since the drive current is applied to the second electrode 36 in the pixel region through the contact electrode 44 of the contact spacer 46, the contact electrode 44 and the second electrode 36 must be formed not to disconnect. To this end, the OLED device according to the first embodiment of the present disclosure forms the protrusion member 42 in the ordinary trapezoid shape and disposes the contact electrode 44 on the upper and side surfaces of the protrusion member 42, thereby stably connecting the contact electrode 44 to the second electrode 36.

The first electrode 32 described above can be grounded so that different drive currents can be applied to the second electrodes 36 in the pixel regions. Accordingly, the brightness values of the pixel regions in the organic light emission layer 34 are different from each other, thereby implementing a gray scale. In other words, the organic light emission layer 34 recombines holes (or electric holes) and electrons and generates an amount of lights corresponding to the drive current which is applied to the second electrode 36.

As shown in FIG. 2, a dummy organic light emission layer formed from the same material as the organic light emission layer 34 is disposed on the separator 48, but it is not limited to this. Alternatively, the dummy organic light emission layer can be removed from the separator 48. In other words, the disposition of the dummy organic light emission layer on the separator 48 may be determined by a shadow mask pattern that is used for the formation of the organic light emission layer 34. For example, if the shadow mask exposes the separator 48, the dummy organic light emission layer can be formed on the separator 48. On the other hand, when the shadow mask does not expose the separator 48, the dummy organic light emission layer can not be formed on separator 48.

Such a contact spacer 46 is electrically connected to the connection electrode 18 which is disposed on the first substrate 10 and is coupled with the driver element 12. In accordance therewith, the drive current from the driver element 12 is applied to the organic light emission diode element 38 through the contact spacer 46 so that the organic light emission diode element 38 emits lights.

Such an OLED device according to the first embodiment of the present disclosure, disposes the organic light emission diode element 38 on the second substrate 30, instead of the first substrate 10 loaded with the driver element 12, thereby preventing the decrement of aperture ratio due to the driver element 12. Moreover, as the driver element can be freely designed regardless the aperture ratio, the OLED device according to the first embodiment of the present disclosure improves a designing margin of the driver element.

Although it is not shown in FIG. 2, a first electric charge injection layer and an first electric charge transfer layer can further be disposed between the first electrode 32 and the organic light emission layer 34. Also, a second electric charge transfer layer and a second electric charge injection layer can further be disposed between the organic light emission layer 34 and the second electrode 36, too.

In this manner, the OLED device according to the first embodiment of the present disclosure bonds the first sealant 50 to the first and second substrates 10 and 30, connection electrode 18, organic light emission diode element 38, contact spacer 46, and second sealant 52. Therefore, the structural strength of the OLED device according to the first embodiment of the present disclosure is improved.

Also, the OLED device, according to the first embodiment of the present disclosure, bonds the first sealant 50 to the contact spacer 46 and the connection electrode 18 so that they are forcibly connected to each other and maintain the connection state. As a result, the OLED device can prevent the contact defect between the contact spacer 46 and the connection electrode 18.

Furthermore, the second sealant 52 as well as the first sealant 50 is further included in the OLED device according to the first embodiment of the present disclosure, thereby preventing external oxygen and/or moisture from intruding into the driver element 12 and/or the organic light emission diode element 38.

Figure 4A:
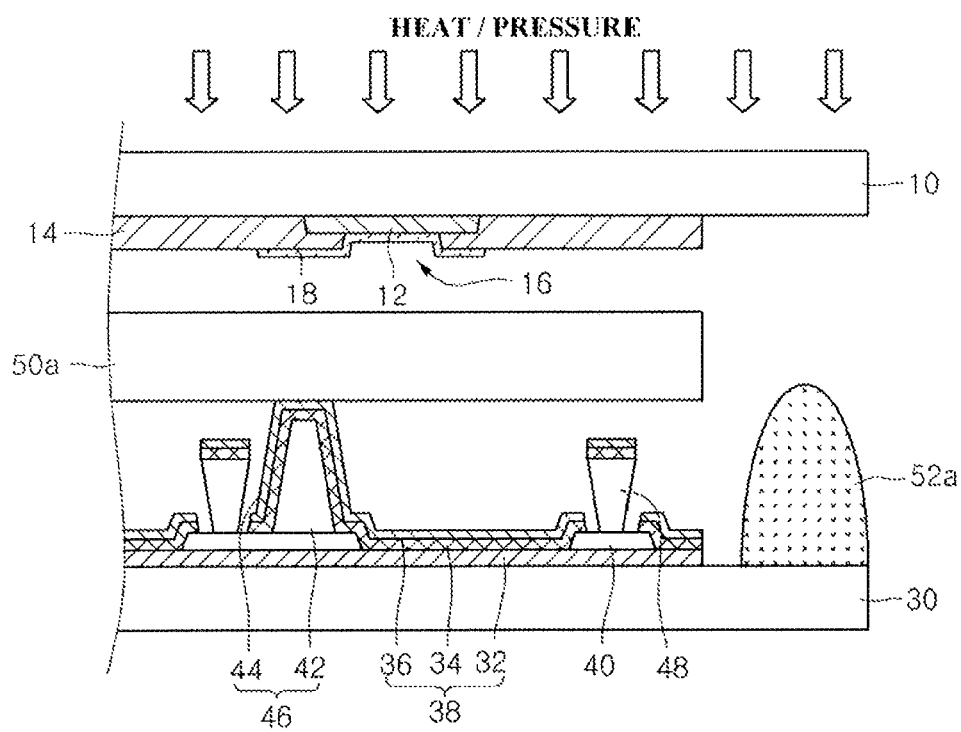
FIGS. 4A and 4B are cross sectional views explaining a method of manufacturing the OLED device according to the first embodiment of the present disclosure.
Figure 4B:
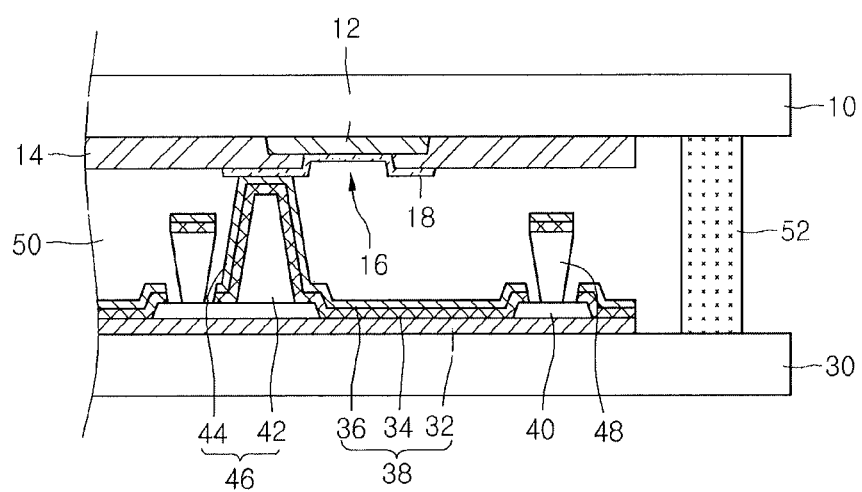

FIGS. 4A and 4B are cross sectional views explaining a method of manufacturing the OLED device according to the first embodiment of the present disclosure. This manufacturing method will now be described in reference with FIG. 2 as well as FIGS. 4A and 4B.

As shown in FIG. 4A, a second substrate 30 is provided with an organic light emission diode element 38, a separator 48, and a contact spacer 46 formed thereon. A first sealant film 50a is disposed on the second substrate 30, and a second sealant material 52a is coated along the edge area of the second substrate 30. Also, a first substrate 10 is disposed on the first sealant film 50a and the second sealant material 52a. On the first substrate 10, a driver element 12 is formed. Detailed elements on the first and second substrates 10 and 30 will be easily understood with reference to FIG. 2.

Sequentially, a heat of about 60 to 100 and a pressure of about 0.2 Pa to 3 MPa are applied to the first substrate 10. The first substrate 10 is depressed toward the second substrate 30 and the sealant film 50a between the first and second substrates 10 and 30 is melted and fills a cavity formed by the first and second substrates 10 and 30, by means of such heat and pressure. As such, the melted sealant film 50a comes into contact with the first and second substrates 10 and 30, organic light emission diode element 38, connection electrode 18, contact spacer 46, and sealant material 52a. Also, the first substrate is continuously depressed until the connection electrode 18 thereon substantially comes into contact with the contact spacer 46.

Next, another heat of about 100° C. to 120° C. is applied to the first substrate 10 during about one to two hours, thereby hardening (or curing) the melted sealant film 50a. In accordance therewith, the melted sealant film 50a is hardened to become the first sealant 50 and the sealant material 52a coated on the edge area of the second substrate 30 is also hardened to become the second sealant 52, as shown in FIG. 4B. The hardened first sealant 50 has an intensive (or intense) bonding power and is intensively bonded to the first and second substrates 10 and 30, organic light emission diode element 38, connection electrode 18, contact spacer 46, and second sealant 52.

In this way, the contact spacer 46 and the connection electrode 18 forcibly contact each other by the intensive bonding power of the first sealant 50. Accordingly, the contact defect between the contact spacer 46 and the connection electrode 18 can be prevented.

Also, the first sealant 50 fills the cavity formed by the first and second substrates 10 and 30, organic light emission diode element 38, connection electrode 18, contact spacer 46, and second sealant 52, and shields the driver element 12 and/or the organic light emission diode element 38 from oxygen and/or moisture which is introduced from the exterior through the second sealant 52. As a result, the driver element 12 and the organic light emission diode element 38 can be protected from the external moisture and/or oxygen.

Moreover, the first sealant 50 is bonded to the first and second substrates 10 and 30, connection electrode 18, organic light emission diode element 38, forcibly contact spacer 46, and second sealant 52, by means of the intensive bonding power. Therefore, the structural strength of the OLED device can be greatly improved.

Figure 5:
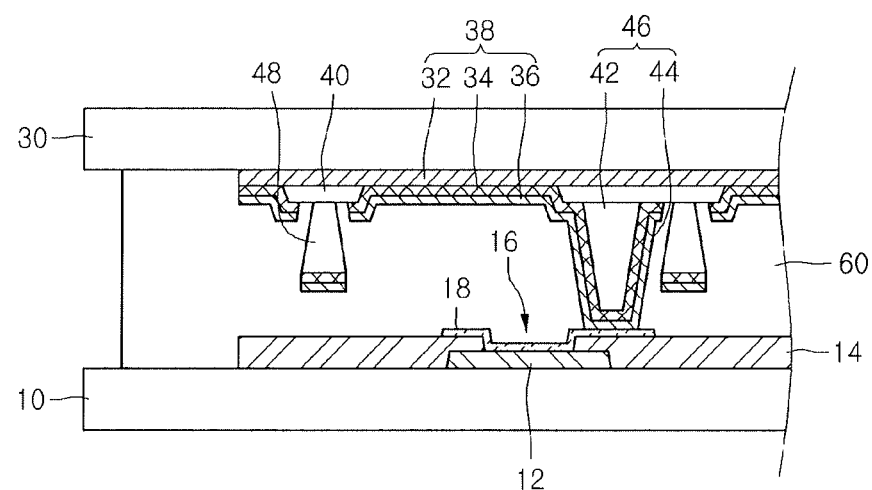
FIG. 5 is a cross sectional view showing an OLED device according to a second embodiment of the present disclosure.

FIG. 5 is a cross sectional view showing an OLED device according to a second embodiment of the present disclosure. The OLED device of the second embodiment has the same configuration as the one of the first embodiment, except that it includes only the first sealant without the second sealant. In other words, in the OLED device of the second embodiment, only the sealant 60 is disposed between the first and second substrates 10 and 30.

By means of the sealant 60 between the first and second substrates 10 and 30, the OLED device of the second embodiment is able to achieve the same technical effects (or advantages) as those realized by the OLED device of the first embodiment. More specifically, the sealant 60 is forcibly bonded to the first and second substrates 10 and 30, connection electrode 18, organic light emission diode element 38, and contact spacer 46, thereby improving the structural strength of the OLED device. Also, the sealant 60 allows the contact spacer 46 and the connection electrode 18 to forcibly contact each other, so as to prevent the contact defect therebetween. Moreover, the sealant 60 fills the cavity formed by the first and second substrates 10 and 30, organic light emission diode element 38, connection electrode 18, and contact spacer 46, so that it thoroughly and substantially avoid the intrusion of external oxygen and/or moisture into the driver element 12 and the organic light emission diode element 38.

Furthermore, the OLED device of the second embodiment removes the second sealant which is included in the one of the first embodiment, so that its manufacturing processes can be simply and its manufacturing costs can be reduced.

Finally, the rest elements in the OLED device of the second embodiment are the same configuration and function as those in the one of the first embodiment. Therefore, the descriptions for the rest elements in the OLED device of the second embodiment will be omitted.

Figure 6A:
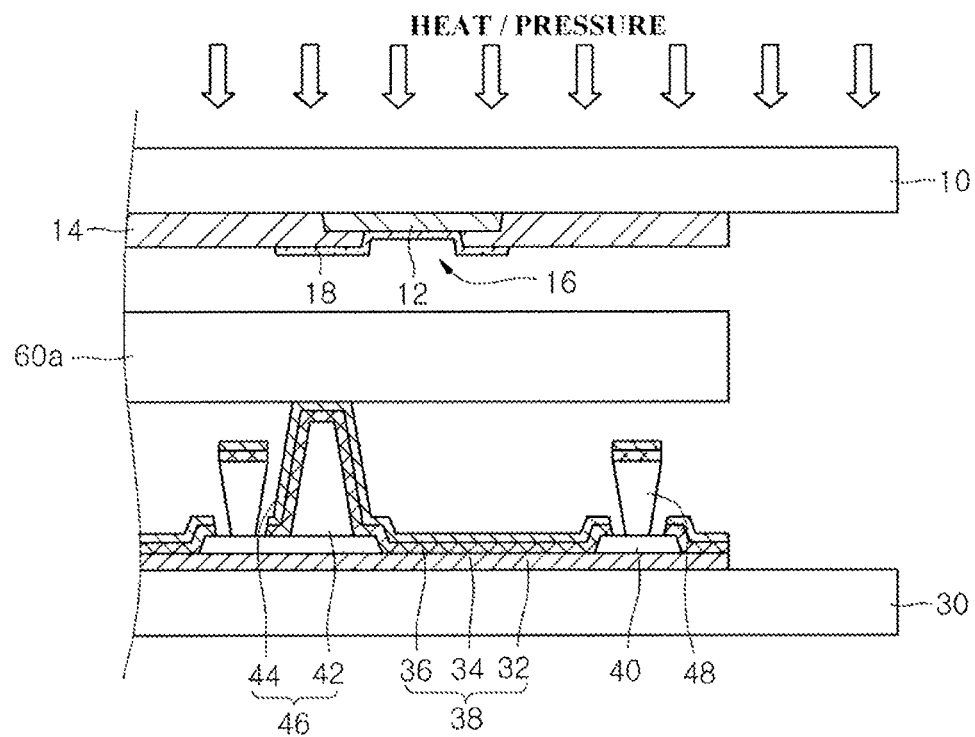
FIGS. 6A and 6B are cross sectional views explaining a method of manufacturing the OLED device according to the second embodiment of the present disclosure.
Figure 6B:
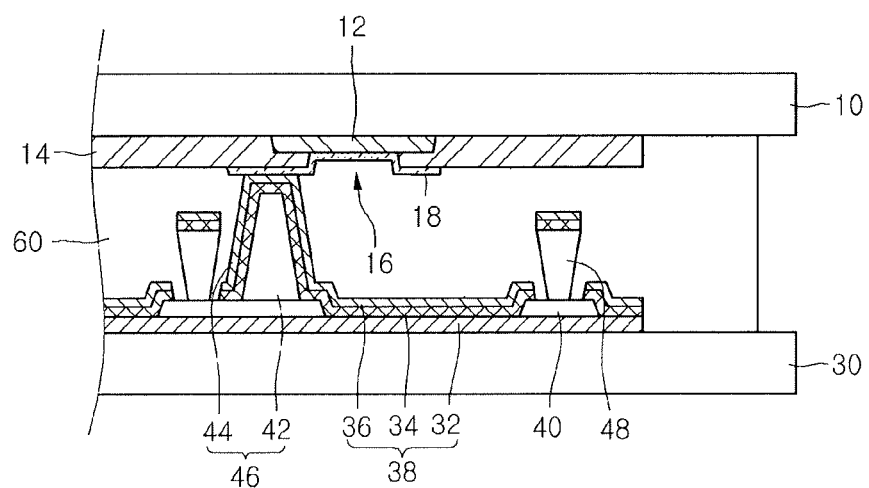

FIGS. 6A and 6B are cross sectional views explaining a method of manufacturing the OLED device according to the second embodiment of the present disclosure. The manufacturing method of the OLED device according to the second embodiment is the same as the one of the first embodiment, except that it is unnecessary to coat the sealant along the edge of the second substrate.

More specifically, a second substrate 30 is provided and a sealant film 60a is disposed on the second substrate 30.

Then, a first substrate 10 is provided on the sealant film 60a in the state such that the sealant material is not coated along the edge area of the second substrate 30, contrary to the manufacturing method of the first embodiment.

Sequentially, a heat of about 60° C. to 100° C. and a pressure of about 0.2 Pa to 3 MPa are applied to the first substrate 10. The first substrate 10 is depressed toward the second substrate 30, and the sealant film 60a between the first and second substrates 10 and 30 is melted and fills a cavity formed by the first and second substrates 10 and 30, by means of such heat and pressure. As such, the melted sealant film 60a come in contact with the first and second substrates 10 and 30, organic light emission diode element 38, connection electrode 18, and contact spacer 46.

Next, another heat of about 100° C. to 120° C. is applied to the first substrate 10 during about two to three hours, thereby hardening (or curing) the melted sealant film 60a. In accordance therewith, the melted sealant film 60a is hardened to become the sealant 60, as shown in FIG. 6B. The hardened sealant 60 has an intensive (or a forcible) bonding power and is forcibly bonded to the first and second substrates 10 and 30, organic light emission diode element 38, connection electrode 18, and contact spacer 46.

In this way, the contact spacer 46 and the connection electrode 18 forcibly contact each other by the intensive bonding power of the sealant 60. Accordingly, the contact defect between the contact spacer 46 and the connection electrode 18 can be prevented.

Also, the sealant 60 fills the cavity formed by the first and second substrates 10 and 30, organic light emission diode element 38, connection electrode 18, and contact spacer 46, and shields it from the intrusion of external oxygen and/or moisture. As a result, the driver element 12 and the organic light emission diode element 38 can be protected from the external moisture and/or oxygen.

Moreover, the sealant 60 is bonded to the first and second substrates 10 and 30, connection electrode 18, organic light emission diode element 38, and contact spacer 46, by means of the intensive bonding power. Therefore, the structural strength of the OLED device can be greatly improved.

The rest process of the second embodiment not explained above is the same as that of the first embodiment. Therefore, the rest process of the second embodiment will be easily understood to ordinary persons skilled in this art, through that of the first embodiment.

Figure 7:
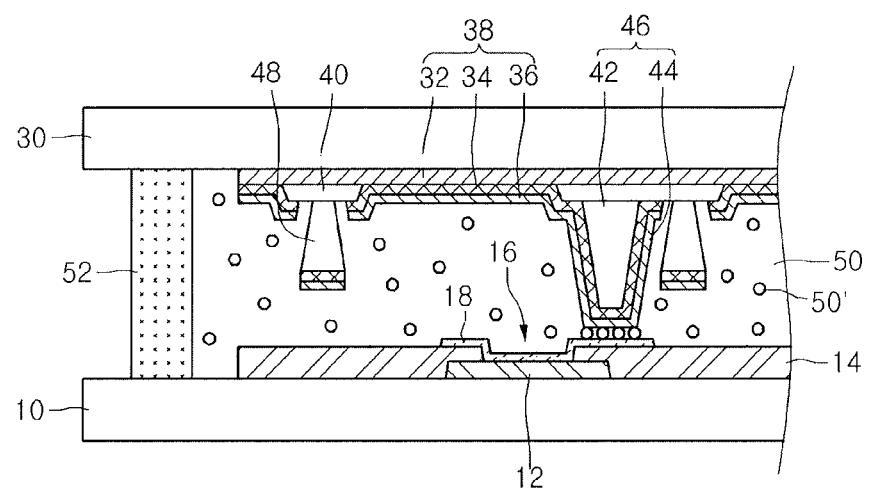
FIG. 7 is a cross sectional view showing an OLED device according to a third embodiment of the present disclosure.

FIG. 7 is a cross sectional view showing an OLED device according to a third embodiment of the present disclosure. Referring to FIG. 7, the OLED device includes a first substrate 10, which has a driver element 12 and a connection electrode 18 contacting the driver element 12, and a second substrate 30 having an organic light emission diode element 38. The first and second substrates 10 and 30 are arranged opposite each other. The organic light emission diode element 38 can include one of red, green, and blue organic light emission diode elements. The red, green, and blue organic light emission diode elements may be arranged in respective pixel regions. In the luminous drive system described above, that is, in case of emitting lights toward the exterior through second substrate 30, the first substrate 10 may be from a non-transparent material such as a metal material, while the second substrate 30 may be from a transparent material, for example, a glass material or a plastic material. The driver element 12 is electrically connected to the organic light emission diode element 38 by means of a contact spacer 46.

A first sealant 50 is disposed between the first and second substrates 10 and 30. The first sealant 50 can include a plurality of conduction balls 50' which are randomly scattered therein. Preferably, the conduction balls 50' may be disposed at least at a predetermined position in the first sealant 50, wherein the predetermined position corresponds to the contact spacer 46. The conduction ball 50' can include an internal core portion and a conduction portion coated thereon. The core portion may be from a plastic material, and the conduction portion can be formed from a low resistive conduction material such as Au, Ag, Cu, and etc.

The first sealant 50 can be bonded to the first and second substrates 10 and 30, the connection electrode 18, the organic light emission diode element 38, the contact spacer 46, and a second sealant 52. In other words, the first sealant 50 is filled into a cavity which is formed by the first and second substrates 10 and 30, the connection electrode 18, the organic light emission diode element 38, the contact spacer 46, and the second sealant 52.

Although it is not shown in the drawings, the second sealant 52 can be eliminated in which case the intrusion of external oxygen and/or moisture can be thoroughly and substantially prevented by means of the first sealant 50. In other words, the first sealant 50 can shield the intrusion of external oxygen and/or moisture and can prevent the contact defect between the contact spacer 46 and the connection electrode 18 by itself, without the use of the second sealant 52.

The first sealant 50 including the plurality of conduction balls 50' can be disposed between the lower surface of the contact spacer 46 and the upper surface of connection electrode 18. As the first sealant 50 is forcibly bonded to the contact spacer 46 and the connection electrode 18, they are also firmly connected to each other by means of the first sealant 50. Thus, the contact spacer 46 and the connection electrode 18 can be electrically connected to each other by means of the plurality of the conduction balls 50' included in the first sealant 50. In other words, the first sealant 50 is intensively bonded to the lower and side surfaces of the contact spacer 46 and the entire surface of the connection electrode 18, so that the contact spacer 46 and the connection electrode 18 can maintain a forcible connecting state. The plural conduction balls 50' included in the first sealant 50 provide a stable electric connection between the contact spacer 46 and the connection electrode 18.

Such a first sealant 50 can be formed from a sealant material of film type or liquid phase type. This first sealant 50 will be explained in detail through the processes of manufacturing the OLED device described below.

The first and second substrates 10 and 30 are combined by the second sealant 52. The second sealant 52 is disposed along the edges of the first and second substrates 10 and 30.

In this manner, since the first sealant 50 fills the cavity (or space) formed by the first and second substrates 10 and 30, the connection electrode 18, the organic light emission diode element 38, the contact spacer 46, and the second sealant 52, it together with the second sealant 52 can thoroughly prevent external oxygen or moisture from contacting the driver element 12 or the organic light emission diode element 46.

Also, the first sealant 50 is bonded to the contact spacer 46 and the connection electrode 18 and is hardened, so that it forces the contact spacer 46 and the connection electrode 18 to contact each other. Accordingly, the contact defects between the contact spacer 46 and the connection electrode 18 can be thoroughly and substantially prevented.

Moreover, as the first sealant 50 fills the cavity, which is formed by the first and second substrates 10 and 30, the connection electrode 18, the organic light emission diode element 38, the contact spacer 46, and the second sealant 52, there is no any empty space provided between the first and second substrates 10 and 30. Therefore, a variation of pressure is not generated between the first and second substrates 10 and 30, and any contact defects between the contact spacer 46 and the connection electrode 18 can be fundamentally (or thoroughly and substantially) prevented.

Furthermore, the first sealant 50 is forcibly bonded to the first and second substrates 10 and 30, the connection electrode 18, the organic light emission diode element 38, the contact spacer 46, and the second sealant 52, so that the structural strength the OLED device can greatly improved.

The conduction balls 50' included in the first sealant 50 provide an electrically stable connection between the contact spacer 46 and the connection electrode 18, thus fundamentally preventing the contact defect between the contact spacer 46 and connection electrode 18. In other words, the conduction balls 50' enable the contact defect not to be generated.

Meanwhile, the first and second sealants 50 and 52 may include a thermal setting material or an optical setting material. For example, the first and second sealant 50 and 52 can be formed from any material which is selected from epoxy group materials, acryl group materials, imide group materials, and silane group materials.

In addition the first and second sealant 50 and 52 can be formed of the materials different from each other. For example, the first sealant 50 may be from any one of the imide group materials and the second sealant 52 may be from any one of the epoxy group materials.

The OLED device according to the third embodiment of the present disclosure will now be explained in detail.

On the first substrate 10, the driver elements 12 are arranged. Also, gate lines and data lines (not shown) can be arranged to cross each other on the first substrate 10. The first substrate 10 can be defined into pixel regions by the gate lines and the data lines.

Each of the driver elements 12 can include at least one switch transistor, drive transistor, and capacitor, which are not shown in the drawing. The switch transistor is connected to the gate line and the data line. This switch transistor is switched by a gate signal on the gate line and selectively applies a data signal on the data line to the capacitor. The capacitor stores the data signal from the switch transistor and maintains the data signal during one frame period. The drive transistor generates an amount of drive current corresponding to the data signal which is stored in the capacitor. The drive current is applied to the organic light emission diode element 38 on the second substrate 30 through the contact spacer 46. The organic light emission diode element 38 emits a light of brightness corresponding to the drive current which is applied from the drive transistor.

A protective layer (or a passivation layer) 14 for protecting the driver elements 12 is disposed to cover the driver elements 12 on the first substrate 10. The protective layer 14 has contact holes 16 each exposing the respective driver elements 12. More specifically, each contact hole 16 can expose a drain electrode of the corresponding drive transistor which is included in the driver element 12.

The connection electrodes 18 are arranged on the protective layer 14, to be connected to the drain electrodes of the respective drive transistors through the respective contact holes. The connection electrodes 18 come in electrical contact with the respective contact spacers 46. In particular, a contact surface of the connection electrode 18 can be formed to have an area (or a size) larger than an area of a contact surface of the contact spacer 46, at least, in order to secure a shift margin of the contact spacer 46.

The second substrate 30 includes the organic light emission diode elements 38 arranged by the pixel regions. Each organic light emission diode element 38 can consist of a first electrode 32, an organic light emission layer 34, and a second electrode 36 which are sequentially formed on the second substrate 30.

The first electrode 32 can be disposed on the entire surface of the second substrate 30. In other words, the first electrode 32 can be formed in one body, in order to be commonly connected to all the organic light emission diode elements 38 on all the pixel regions. This first electrode 32 may be from a transparent conduction material capable of transmitting light. For example, the first electrode 32 can include indium-tin-oxide ITO or indium-zinc-oxide IZO.

On the first electrode 32, a buffer pattern 40 is disposed in correspondence with the boundary areas of the pixel regions. The buffer pattern 40 may be formed of an insulation material. For example, the buffer pattern 40 can include silicon oxide or silicon nitride.

A separator 48 is disposed on the buffer pattern 40. The separator 48 allows the organic light emission diode elements 38 to be formed in the respective pixel regions. In other words, the organic light emission diode elements 38 can be formed separately from each other by the pixel regions, by means of the separator 48. This separator 48 can be formed in a taper shape (or an inverted trapezoid shape). As such, the organic light emission layer 34 or the second electrode 36 can be independently formed by the pixel regions by means of the separator 48, upon the formation of the organic light emission layer 34 or the second electrode 36 on the first electrode 32.

Protrusion members 42 are arranged on the buffer pattern 40. Each protrusion member 42 is a framework for forming a shape of the contact spacer 46 described below. The protrusion member 42 can be formed in an ordinary trapezoid shape. In accordance therewith, a contact electrode 44 to be disposed thereon can be formed on the entire surface (i.e., on the upper and side surfaces) of the protrusion member 42.

The organic light emission layer 34 is disposed on the first electrode 32 corresponding to each pixel region. The organic light emission layer 34 can include a red organic material layer displaying red colors, a green organic material layer displaying green colors, and a blue organic material layer displaying blue colors. The red, green, and blue organic light emission layers can be arranged in the respective pixel regions in the first electrode 32. Moreover, the same organic material as the organic light emission layer 34 can be further disposed on the protrusion member 42. Alternatively, the organic light emission layer 34 can be disposed only in each pixel region.

There is the second electrode 36 disposed on the organic light emission layer 34 in each pixel region. As with the organic light emission layer, the second electrode 36 is disposed in each pixel region.

This second electrode 36 may be from a conductive material which has a work function higher than that of the first electrode 32. Also, the second electrode 36 can be formed from a conductive material of superior light reflectivity, so as to reflect lights generated in the organic light emission layer 34 toward the first electrode 32. To this end, the second electrode 36 can include a single layer formed from any one among Ag, Cu, Au, Li, Ca, Ba, and Hg. Alternatively, the second electrode 36 can be any one among a double layer of Li/Al, a double layer of Ca/Al, a double layer of Ba/Al, a triple layer of Al/Ag/Ca, and a triple layer of Al/Ca/Ag. In another formation, the second electrode 36 can be formed from an alloy of Mg and Al or an alloy of Li and Al.

Moreover, the same conductive material as the second electrode 36 is formed on the organic light emission layer 34, which is also disposed on the protrusion member 32, and becomes the contact electrode 44. The contact electrode 44 can be formed in unification with the second electrode 36 which is disposed in the pixel region. Also, the contact electrode 44 is disposed on the entire surface (i.e., the upper and side surfaces) of the protrusion member 42.

This contact electrode 44 together with the protrusion member 42 forms the contact spacer 46. Since the drive current is applied to the second electrode 36 in the pixel region through the contact electrode 44 of the contact spacer 46, the contact electrode 44 and the second electrode 36 must be formed not to disconnect. To this end, the OLED device according to the third embodiment of the present disclosure forms the protrusion member 42 in the ordinary trapezoid shape and disposes the contact electrode 44 on the upper and side surfaces of the protrusion member 42, thereby stably connecting the contact electrode 44 to the second electrode 36.

The first electrode 32 described above can be grounded so that different drive currents can be applied to the second electrodes 36 in the pixel regions. Accordingly, the brightness values of the pixel regions in the organic light emission layer are different from each other, thereby implementing a gray scale. In other words, the organic light emission layer 34 recombines holes (or electric holes) and electrons and generates an amount of light corresponding to the drive current which is applied to the second electrode 36.

As shown in FIG. 7, a dummy organic light emission layer formed from the same material as the organic light emission layer 34 is disposed on the separator 48, but it is not limited to this. Alternatively, the dummy organic light emission layer can be removed from the separator 48. In other words, the disposition of the dummy organic light emission layer on the separator 48 may be determined by a shadow mask pattern that is used for the formation of the organic light emission layer 34. For example, if the shadow mask exposes the separator 48, the dummy organic light emission layer can be formed on the separator 48. On the other hand, when the shadow mask does not expose the separator 48, the dummy organic light emission layer can not be formed on separator 48.

Such a contact spacer 46 is electrically connected to the connection electrode 18 which is disposed on the first substrate 10 and is coupled with the driver element 12. In accordance therewith, the drive current from the driver element 12 is applied to the organic light emission diode element 38 through the contact spacer 46 so that the organic light emission diode element 38 emits lights.

Such an OLED device according to the third embodiment of the present disclosure, disposes the organic light emission diode element 38 on the second substrate 30, instead of the first substrate 10 loaded with the driver element 12, thereby preventing the decrement of aperture ratio due to the driver element 12. Moreover, as the driver element can be freely designed regardless the aperture ratio, the OLED device according to the third embodiment of the present disclosure improves a designing margin of the driver element.

Although it is not shown in FIG. 7, a first electric charge injection layer and a first electric charge transfer layer can further be disposed between the first electrode 32 and the organic light emission layer 34. Also, a second electric charge transfer layer and a second electric charge injection layer can further be disposed between the organic light emission layer 34 and the second electrode 36.

In this manner, the OLED device according to the third embodiment of the present disclosure bonds the first sealant 50 to the first and second substrates 10 and 30, connection electrode 18, organic light emission diode element 38, contact spacer 46, and second sealant 52. Therefore, the structural strength of the OLED device according to the third embodiment of the present disclosure is improved.

Also, the OLED device, according to the third embodiment of the present disclosure, bonds the first sealant 50 to the contact spacer 46 and the connection electrode 18 so that they are forcibly connected to each other and maintain the connection state. As a result, the OLED device can prevent the contact defect between the contact spacer 46 and the connection electrode 18. Particularly, the conduction balls 50' included in the first sealant 50 can secure a stable electric connection between the contact spacer 46 and the connection electrode 18.

Furthermore, the second sealant 52 as well as the first sealant 50 is further included in the OLED device according to the third embodiment of the present disclosure, thereby preventing external oxygen and/or moisture from intruding into the driver element 12 and/or the organic light emission diode element 38. The first sealant 50 can be formed from the sealant material of film type or the liquid phase sealant material, as explained above.

Figure 8A:
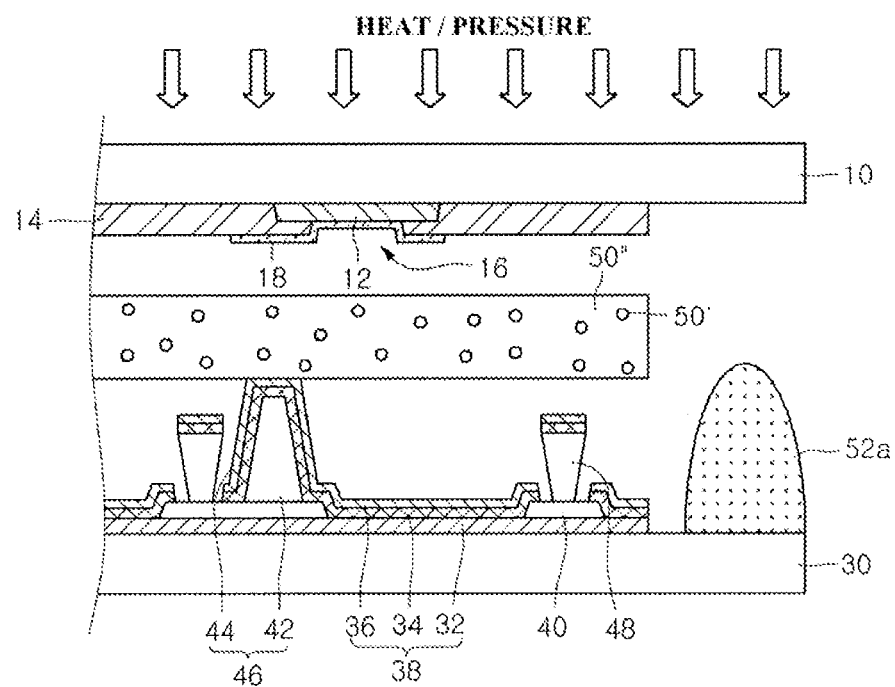
FIGS. 8A and 8B are cross sectional views explaining a method of manufacturing the OLED device according to the third embodiment of the present disclosure.
Figure 8B:
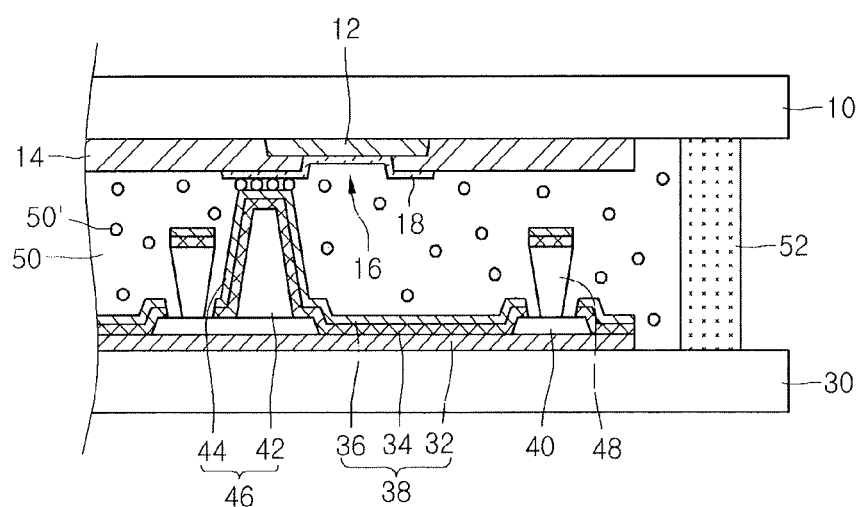

FIGS. 8A and 8B are cross sectional views explaining a first method of manufacturing the OLED device according to the third embodiment of the present disclosure. As shown in FIG. 8A, a second substrate 30 is provided with an organic light emission diode element 38, a separator 48, and a contact spacer 46, which are formed on the second substrate 30.

A sealant film 50a is disposed on the second substrate, and a sealant material 52a is coated on the edge area of the second substrate 30. The sealant film 50a is a film type member which includes a plurality of conduction balls 50' mixed and scattered into another sealant material 50". Preferably, the conduction balls 50' may be disposed at least at a predetermined position in the sealant material 50", wherein the predetermined position corresponds to the contact spacer 46. Also, a first substrate 10 is disposed on the sealant film 50a and the sealant material 52a, thereby being combined with the second substrate 30. On the first substrate 10, a driver element 12 is formed. Detailed elements on the first and second substrates 10 and 30 will be easily understood with reference to FIG. 7.

Sequentially, a heat of about 60 to 100 and a pressure of about 0.2 Pa to 3 MPa are applied to the first and second substrates 10 and 30. The first substrate 10 is depressed toward the second substrate 30 and the sealant film 50a between the first and second substrates 10 and 30 is melted and fills a cavity formed by the first and second substrates 10 and 30, by means of such heat and pressure. As such, the melted sealant film 50a comes into contact with the first and second substrates 10 and 30, organic light emission diode element 38, connection electrode 18, contact spacer 46, and sealant material 52a. At this time, these heat and pressure are continuously applied to the first substrate until the connection electrode 18 of the first substrate 10 substantially contacts the contact spacer 46 of the second substrate 30.

Next, another heat of about 80 to 120 is applied to the first substrate 10 during about a half hour to three hours, thereby hardening (or curing) the melted sealant film 50a. Preferably, the another heat may be about 100 and the applying period can be about three hours. In accordance therewith, the melted sealant film 50a is hardened to become the first sealant 50 and the sealant material 52a coated on the edge area of the second substrate 30 is also hardened to become the second sealant 52, as shown in FIG. 8B. The hardened first sealant 50 is forcibly bonded to the first and second substrates 10 and 30, organic light emission diode element 38, connection electrode 18, contact spacer 46, and second sealant 52, because of its intensive bonding power.

Particularly, the plurality of the conduction balls 50' included in the first sealant 50 are arranged between the contact spacer 46 and the connection electrode 18 so that they can be electrically connected to each other by means of the conduction balls 50'. In particular, the plurality of the conduction balls 50' are arranged between the lower surface of the contact spacer 46 and the upper surface of the connection electrode 18 contacting the driver element 12, thereby electrically connecting and contacting the lower surface of the contact spacer 46 with the upper surface of the connection electrode 18. Also, the conduction balls 50' are fixed by means of the hardened first sealant 50, as the first sealant 50 around the conduction balls 50' between the contact spacer 46 and the connection electrode 18 is hardened. Accordingly, the conduction balls 50' are not moved. As a result, the contact spacer 46 and the connection electrode 18 can be electrically and stably connected to each other.

In this way, the contact spacer 46 and the connection electrode 18 forcibly contact each other by the intensive bonding power of the first sealant 50. Accordingly, the contact defect between the contact spacer 46 and the connection electrode 18 can be prevented.

Also, the first sealant 50 fills the cavity formed by the first and second substrates 10 and 30, organic light emission diode element 38, connection electrode 18, contact spacer 46, and second sealant 52, and shields the driver element 12 and/or the organic light emission diode element 38 from oxygen and/or moisture which is introduced from the exterior through the second sealant 52. As a result, the driver element 12 and the organic light emission diode element 38 can be protected from the external moisture and/or oxygen.

Moreover, the first sealant 50 is bonded to the first and second substrates 10 and 30, connection electrode 18, organic light emission diode element 38, contact spacer 46, and second sealant 52, by means of the intensive bonding power. Therefore, the structural strength of the OLED device can be greatly improved.

Figure 9A:
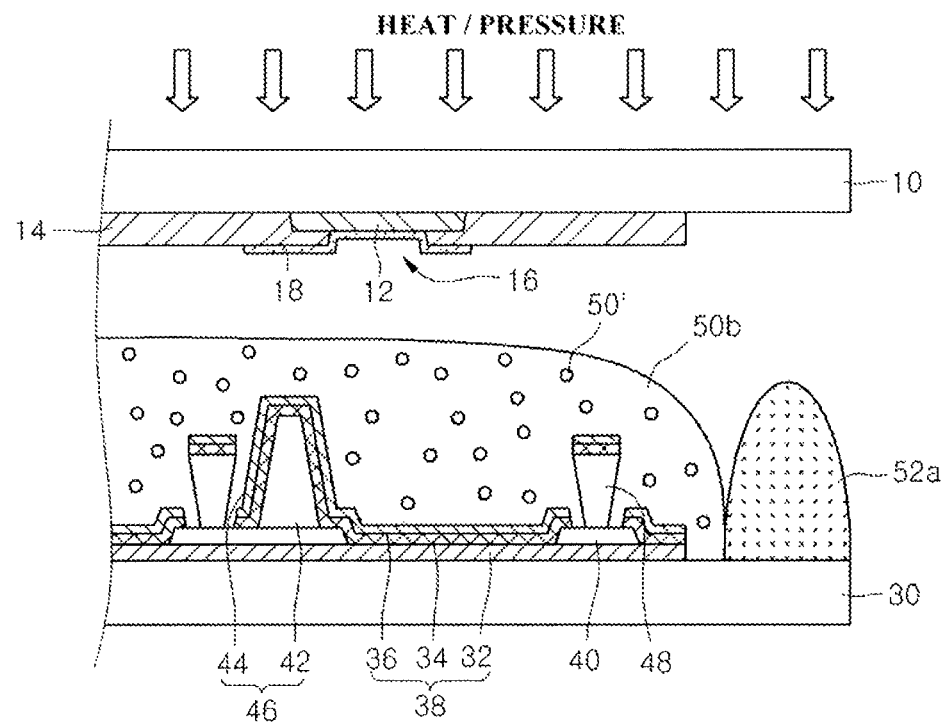
FIGS. 9A and 9B are cross sectional views explaining another method of manufacturing the OLED device according to the third embodiment of the present disclosure.
Figure 9B:
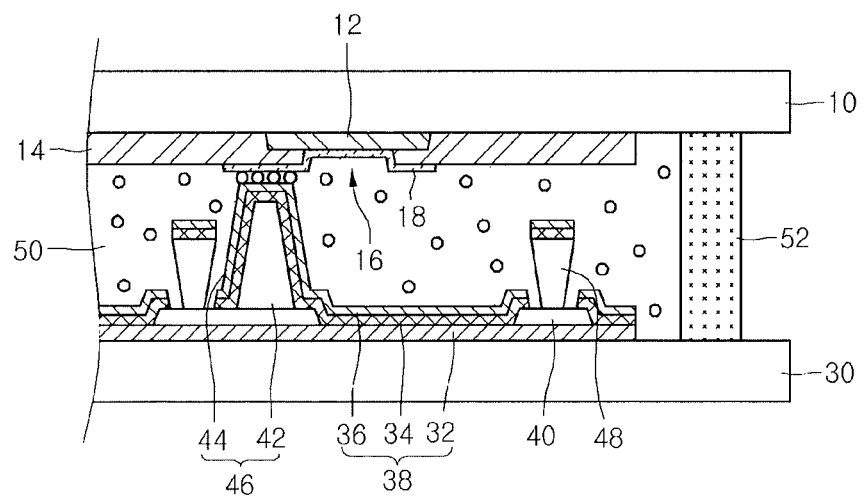

FIGS. 9A and 9B are cross sectional views explaining another method of manufacturing the OLED device according to the third embodiment of the present disclosure. This method has the same manufacturing processes as these of the first method, except that the first sealant is formed from a sealant material of liquid phase.

In accordance with another method of manufacturing the OLED device of the third embodiment, a second substrate 30 is provided with an organic light emission diode element 38, a separator 48, and a contact spacer 46 formed thereon, as shown in FIG. 9A. A liquid phase sealant 50a is coated on the second substrate 30, and a sealant material 52a is coated along the edge area of the second substrate 30. The liquid phase sealant 50a is a liquid phase member which includes a plurality of conduction balls 50' mixed and scattered into another sealant material 50b. Preferably, the conduction balls 50' may be disposed at least at a predetermined position in the sealant material 50b, wherein the predetermined position corresponds to the contact spacer 46. Also, a first substrate 10 is disposed on the liquid phase sealant 50a and the sealant material 52a, thereby being combined with the second substrate 30. On the first substrate 10, a driver element 12 is formed. Detailed elements on the first and second substrates 10 and 30 will be easily understood with reference to FIG. 7.

Sequentially, a heat of about 60 to 100 and a pressure of about 0.2 Pa to 3 MPa are applied to the combined first and second substrates 10 and 30. The first substrate 10 is depressed toward the second substrate 30 and the liquid phase sealant 50a between the first and second substrates 10 and 30 is melted and fills a cavity formed by the first and second substrates 10 and 30, by means of such heat and pressure. As such, the melted liquid phase sealant 50a come in contact with the first and second substrates 10 and 30, organic light emission diode element 38, connection electrode 18, contact spacer 46, and sealant material 52a. Also, these heat and pressure are continuously maintained until the connection electrode 18 of the first substrate 10 substantially comes in contact with the contact spacer 46 of the second substrate 30.

Next, another heat of about 100° C. to 120° C. is applied to the combined first and second substrates 10 and 30 during about a half hour to three hours, thereby hardening (or curing) the melted liquid phase sealant 50a. In accordance therewith, the melted liquid phase sealant 50a is hardened to become the first sealant 50 and the sealant material 52a coated on the edge area of the second substrate 30 is also hardened to become the second sealant 52, as shown in FIG. 9B. The hardened first sealant 50 has an intensive bonding power, thereby being forcibly bonded to the first and second substrates 10 and 30, organic light emission diode element 38, connection electrode 18, contact spacer 46, and second sealant 52.

Specially, the plurality of the conduction balls 50' included in the first sealant 50 are arranged between the contact spacer 46 and the connection electrode 18 so that they can be electrically connected to each other by means of the conduction balls 50'. In particular, the plurality of the conduction balls 50' are arranged between the lower surface of the contact spacer 46 and the upper surface of the connection electrode 18 contacting the driver element 12, thereby electrically connecting and contacting the lower surface of the contact spacer 46 with the upper surface of the connection electrode 18. Also, the conduction balls 50' are fixed by means of the hardened first sealant 50, as the first sealant 50 around the conduction balls 50' between the contact spacer 46 and the connection electrode 18 is hardened. Accordingly, the conduction balls 50' are not moved. As a result, the contact spacer 46 and the connection electrode 18 can be electrically and stably connected to each other.

In this way, the contact spacer 46 and the connection electrode 18 forcibly contact each other by the intensive bonding power of the first sealant 50. Accordingly, the contact defect between the contact spacer 46 and the connection electrode 18 can be prevented.

Also, the first sealant 50 fills the cavity formed by the first and second substrates 10 and 30, organic light emission diode element 38, connection electrode 18, contact spacer 46, and second sealant 52, and shields the driver element 12 and/or the organic light emission diode element 38 from oxygen and/or moisture which is introduced from the exterior through the second sealant 52. As a result, the driver element 12 and the organic light emission diode element 38 can be protected from the external moisture and/or oxygen.

Moreover, the first sealant 50 is bonded to the first and second substrates 10 and 30, connection electrode 18, organic light emission diode element 38, contact spacer 46, and second sealant 52, by means of the intensive bonding power. Therefore, the structural strength of the OLED device can be greatly improved.

Although the methods of manufacturing the OLED devices according to the first and third embodiment form the second sealant 52 as shown in the drawings, the second sealant 52 can be removed when the first sealant 50 can thoroughly and substantially shield the driver element 12 and/or the organic light emission diode element 38 from the external oxygen and moisture.

In another way, the first sealant 50 in the OLED device of the third embodiment can be positioned only between the contact spacer 46 and the connection electrode 18. In this case, the contact spacer 46 and the connection electrode 18 can also come into forcible contact with each other by means of the first sealant 50, and can be electrically and stably connected to each other by means of the conduction balls 50' included in the first sealant 50. In this way, since the first sealant 50 is formed only in the limited space between the contact spacer 46 and the connection electrode 18 instead of the entire space between the first and second substrates 10 and 30, the sealant material costs may be greatly reduced.

As described above, the OLED devices according to the embodiments of the present disclosure fills the first sealant in the cavity (or space) which is formed by the first and second substrates, connection electrode, organic light emission diode element, contact spacer, and the second sealant. Therefore, the OLED devices can fundamentally prevent the driver element and/or the organic light emission diode element from contacting external oxygen and/or moisture. Since there is no any empty cavity (or space) provided between the first and second substrates, a pressure variation is not generated between the first and second substrates. As a result, the contact defect between the contact spacer and the connection electrode can be thoroughly and substantially prevented.

The first sealant is bonded and hardened to the contact spacer and the connection electrode, thereby forcibly contacting the contact spacer with the connection electrode. Therefore, the OLED devices according to the embodiments of the present disclosure can fundamentally prevent the contact defect between the contact spacer and the connection electrode.

Also, since the first sealant is forcibly bonded to the first and second substrates, connection electrode, organic light emission diode element, contact spacer, and second sealant, the OLED devices according to the embodiments of the present disclosure can greatly improve their structural strength.

Moreover, the OLED devices according to the embodiments of the present disclosure provide a stable electric connection between the contact spacer and the connection electrode by means of the conduction balls which are included in the first sealant. As a result, the OLED devices can fundamentally prevent the contact defect between the contact spacer and the connection electrode.

It will be apparent to those skilled in the art that various modifications and variations can be made in the present disclosure. Thus, it is intended that the present disclosure cover the modifications and variations of this embodiment provided they come within the scope of the appended claims and their equivalents.

What is claimed is:

1. An organic electro-luminescence display device comprising:
    a first substrate, wherein a driver element, a protective layer and a connection electrode are disposed on the first substrate, and the connection electrode is connected to the driver element;
    a second substrate opposed to the first substrate, wherein an organic light emission diode element is disposed on the second substrate;
    a contact spacer disposed on the second substrate and electrically connected to the connection electrode; and
    a first sealant filing a cavity between the first and second substrates,
    wherein the first sealant is bonded to the contact spacer and the connection electrode and maintains the electrical connection between the contact spacer and the connection electrode,
    wherein the protective layer has contact holes exposing the driver element,
    wherein the connection electrode is arranged on the protective layer and connected to the driver element through the contact holes,
    wherein an entire upper surface of the connection electrode comes in contact with the first sealant or the contact spacer, and
    wherein a side surface of the contact spacer comes in contact with the first sealant.

2. The organic electro-luminescence display device claimed as claim 1, wherein the organic light emission diode element includes a first electrode, an organic light emission layer, and a second electrode, and the contact spacer includes a protrusion member and a contact electrode unified with the second electrode in one body.

3. The organic electro-luminescence display device claimed as claim 2, wherein the connection electrode is electrically connected to the contact electrode of the contact spacer.

4. The organic electro-luminescence display device claimed as claim 2, further comprises a second sealant disposed along the edge areas of the first and second substrates.

5. The organic electro-luminescence display device claimed as claim 1, wherein the first sealant is bonded to the first and second substrates, the connection electrode, the organic light emission diode element, and the contact spacer.

6. The organic electro-luminescence display device according to claim 1, wherein the first sealant includes a plurality of conduction balls.

7. The organic electro-luminescence display device claimed as claim 6, wherein the organic light emission diode element includes a first electrode, an organic light emission layer, and a second electrode, and the contact spacer includes a protrusion member and a contact electrode unified with the second electrode in one body.

8. The organic electro-luminescence display device according to claim 7, wherein the connection electrode is electrically connected to the contact electrode of the contact spacer through the conduction balls.

9. The organic electro-luminescence display device according to claim 8, wherein the electrical connection between the contact and the connection electrodes is maintained by the conduction balls.

10. The organic electro-luminescence display device claimed as claim 6, wherein the first sealant is bonded to the first and second substrates, the connection electrode, the organic light emission diode element, and the contact spacer.

11. The organic electro-luminescence display device claimed as claim 6, further comprises a second sealant disposed along the edge areas of the first and second substrates.

12. The organic electro-luminescence display device claimed as claim 6, wherein the first sealant is formed in a film type member that the conduction balls are mixed and scattered into a sealant material.

13. The organic electro-luminescence display device claimed as claim 12, wherein the conduction balls are disposed at least at a predetermined position in the sealant material, and the predetermined position corresponds to the contact spacer.

14. The organic electro-luminescence display device claimed as claim 6, wherein the first sealant is formed in a liquid phase member that the conduction balls are mixed and scattered into a sealant material.

15. The organic electro-luminescence display device claimed as claim 14, wherein the conduction balls are disposed at least at a predetermined position in the sealant material, and the predetermined position corresponds to the contact spacer.

16. An organic electro-luminescence display device comprising:
- a first substrate, wherein a driver element, a protective layer and a connection electrode are disposed on the first substrate and the connection electrode is connected to the driver element;
- a second substrate opposed to the first substrate, wherein an organic light emission diode element is disposed on the second substrate;
- a contact spacer disposed on the second substrate and electrically connected to the connection electrode; and
- a first sealant disposed between the contact spacer and the connection electrode and including a plurality of conduction balls, wherein the first sealant is bonded to the contact spacer and the connection electrode, and the electrical connection between the contact spacer and the connection electrode is maintained by the conduction balls included in the first sealant, wherein the protective layer has contact holes exposing the driver element, wherein the connection electrode is arranged on the protective layer and connected to the driver element through the contact holes, and wherein a side surface of the contact spacer and an entire upper surface of the connection electrode come in contact with the first sealant including the conduction balls.

17. The organic electro-luminescence display device claimed as claim 16, wherein the conduction balls are disposed at least at a predetermined position in the first sealant, and the predetermined position corresponds to the contact spacer.

* * * * *